(12) United States Patent
Kiwanami et al.

(10) Patent No.: US 9,331,011 B2
(45) Date of Patent: May 3, 2016

(54) ELECTRONIC COMPONENT BUILT-IN SUBSTRATE AND METHOD OF MANUFACTURING THE SAME

(71) Applicant: SHINKO ELECTRIC INDUSTRIES CO., LTD., Nagano-shi (JP)

(72) Inventors: Takayuki Kiwanami, Nagano (JP); Junji Sato, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 48 days.

(21) Appl. No.: 14/221,567

(22) Filed: Mar. 21, 2014

(65) Prior Publication Data
US 2014/0291859 A1  Oct. 2, 2014

(30) Foreign Application Priority Data
Mar. 28, 2013 (JP) .................. 2013-068549

(51) Int. Cl.
| | |
|---|---|
| H01L 23/053 | (2006.01) |
| H01L 23/498 | (2006.01) |
| H01L 23/485 | (2006.01) |
| H01L 23/13 | (2006.01) |
| H01L 23/538 | (2006.01) |

(52) U.S. Cl.
CPC ........ *H01L 23/49894* (2013.01); *H01L 23/485* (2013.01); *H01L 23/49822* (2013.01); *H01L 23/13* (2013.01); *H01L 23/5389* (2013.01); *H01L 2224/16225* (2013.01); *H01L 2224/32225* (2013.01); *H01L 2224/73204* (2013.01); *H01L 2924/1517* (2013.01); *H01L 2924/15311* (2013.01)

(58) Field of Classification Search
CPC .................. H01L 2924/14; H01L 2924/01079; H01L 2924/01013; H01L 23/485; H01L 23/5383; H01L 23/5389; H01L 2924/1517

USPC .................. 257/E21.705, 750, 758, 761, 762, 257/773–776, 678, 700, 724, 725, 778; 438/106, 127, 614, 618, 666, 667, 669

See application file for complete search history.

(56) References Cited

U.S. PATENT DOCUMENTS

| | | | |
|---|---|---|---|
| 2005/0017347 A1* | 1/2005 | Morimoto et al. | ............ 257/703 |
| 2008/0165515 A1* | 7/2008 | Hsu | ......... H01L 23/50 361/783 |
| 2010/0018761 A1* | 1/2010 | Wang et al. | ................... 174/260 |
| 2011/0240354 A1 | 10/2011 | Furuhata | |
| 2012/0153493 A1* | 6/2012 | Lee | ......... H01L 25/16 257/774 |
| 2013/0292826 A1* | 11/2013 | Lin et al. | ....................... 257/737 |

FOREIGN PATENT DOCUMENTS

JP    2011-216740 A1   10/2011

* cited by examiner

*Primary Examiner* — Matthew E Warren
(74) *Attorney, Agent, or Firm* — Kratz, Quintos & Hanson, LLP (57) ABSTRACT

An electronic component built-in substrate, includes, a substrate having an opening portion, a first wiring layer formed in the substrate, an electronic component arranged in the opening portion, a first insulating layer formed on one face of the substrate and sealing the electronic component, a second insulating layer formed on other face of the substrate, a second wiring layer formed on the first insulating layer, and a third wiring layer formed on the second insulating layer. The first insulating layer is formed of an inner insulating layer covering the one face of the substrate and filling an inside of the opening portion, and an outer insulating layer formed on the inner insulating layer.

7 Claims, 11 Drawing Sheets

ELECTRONIC COMPONENT BUILT-IN SUBSTRATE AND METHOD OF MANUFACTURING THE SAME

CROSS-REFERENCE TO RELATED APPLICATIONS

This application is based upon and claims the benefit of priority of the prior Japanese Patent Application No. 2013-068549. filed on Mar. 28, 2013, the entire contents of which are incorporated herein by reference.

FIELD

This invention is related to an electronic component built-in substrate and a method of manufacturing the same.

BACKGROUND

Along with the recent development in the electronic equipment, the wiring substrates of the electronic component devices for use in the electronic equipment have been required to have smaller sizes, higher performance, and the like. In order to respond to such requirement, the electronic component built-in substrates in which the electronic component is built in the wiring substrate have been put into practical use.

In one example of such electronic component built-in substrate, the electronic component is arranged in an opening portion of a core substrate, and build-up wirings are formed on both faces side of the core substrate.

A related art is disclosed in Japanese Laid-open Patent. Publication No. 2011-216740.

SUMMARY

When the electronic component built-in substrate is manufactured, there is a step of hot pressing a resin film to bury the resin into a gap around the electronic component arranged in the opening portion of the core substrate.

Particularly, in the case that the thickness of the electronic component is thinner than the thickness of the core substrate, since the volume of the burying space is large, the resin layer is formed so as to be depressed at the opening portion of the core substrate. When the flatness of the resin layer is poor, it is difficult to form fine wiring layers thereon with a good yield.

According to one aspect discussed herein, there is provided an electronic component built-in substrate, including a substrate having an opening portion, a first wiring layer formed in the substrate, an electronic component arranged in the opening portion, a first insulating layer formed on one face of the substrate and sealing the electronic component, a second insulating layer formed on other face of the substrate, a second wiring layer formed on the first insulating layer, and a third wiring layer formed on the second insulating layer, wherein the first insulating layer is formed of an inner insulating layer covering the one face of the substrate and filling an inside of the opening portion, and an outer insulating layer formed on the inner insulating layer.

Also, according to another aspect discussed herein, there is provided a method of manufacturing an electronic component built-in substrate, including preparing a substrate including a first wiring layer, and forming an opening portion in the substrate, arranging an electronic component in the opening portion, forming an inner insulating layer on one face of the substrate, the inner insulating layer sealing the electronic component, forming an outer insulating layer on the inner insulating layer to obtain a first insulating layer formed of the inner insulating layer and the outer insulating layer on the one face of the substrate, and forming a second insulating layer on other face of the substrate, and forming a second wiring layer on the first insulating layer and forming a third wiring layer on the second insulating layer.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A to 2D are cross-sectional views depicting the method of manufacturing an electronic component built-in substrate of the embodiment (Part 2).

FIGS. 7A to 7D are cross-sectional views depicting the method of manufacturing an electronic component built-in substrate of the embodiment (Part 7).

DESCRIPTION OF EMBODIMENT

Hereinbelow, an embodiment will be described with reference to the accompanying drawings.

FIGS. 1A to 9 are views depicting a method of manufacturing an electronic component built-in substrate of an embodiment. FIG. 10 is a view depicting an electronic component built-in substrate of the embodiment. Hereinbelow, while explaining a method of manufacturing an electronic component built-in substrate, a structure of the electronic component built-in substrate will be explained.

Figure 1A:
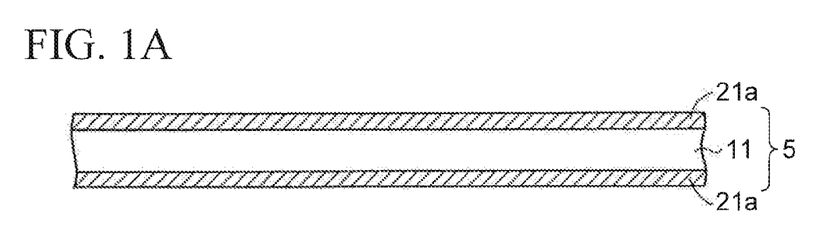
FIGS. 1A to 1D are cross-sectional views depicting a method of manufacturing an electronic component built-in substrate of an embodiment (Part 1).

In the method of manufacturing the electronic component built-in substrate of the embodiment, first, a core wiring substrate including a core member and wiring layers is prepared. Specifically, as depicted in FIG. 1A, first, a copper clad laminate 5 is prepared in which a copper foil 21a is laminated on both faces side of a first core member 11 whose thickness is about 200 μm respectively. An insulating material made of a resin such as glass epoxy resin is used as the first core member 11.

Figure 1B:
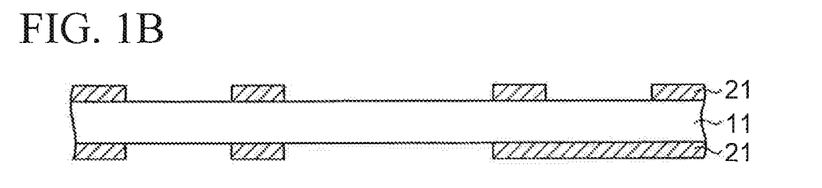

Then, as depicted in FIG. 1B, the copper foils 21a on both faces side of the copper clad laminate 5 are patterned by photolithography and wet etching to form a first wiring layer 21 on both sides respectively. The thickness of the first wiring layer 21 is about 18 μm to 35 μm.

Figure 1C:
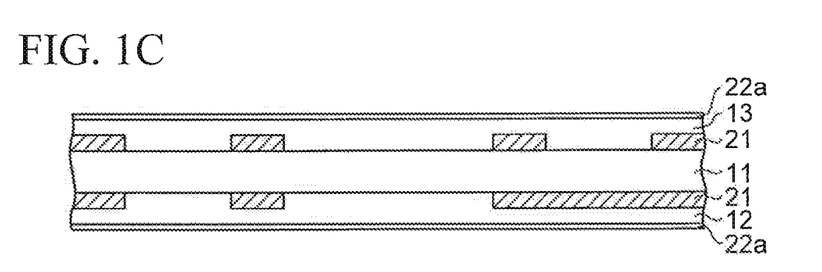

Thereafter, as depicted in FIG. 1C, a second core member 12 and a copper foil 22a are laminated on the lower face of the first core member 11. Also simultaneously, a third core member 13 and another copper foil 22a are laminated on the upper face of the first core member 11. The thickness of each of the second core member 12 and the third core member 13 is about 100 μm.

The second core member 12 and the third core member 13 are each formed by heating and pressing pre-preg. The pre-preg is a sheet-shaped intermediate material made of a semi-cured resin obtained by impregnating glass cloth or the like with a resin such as epoxy resin.

Figure 1D:
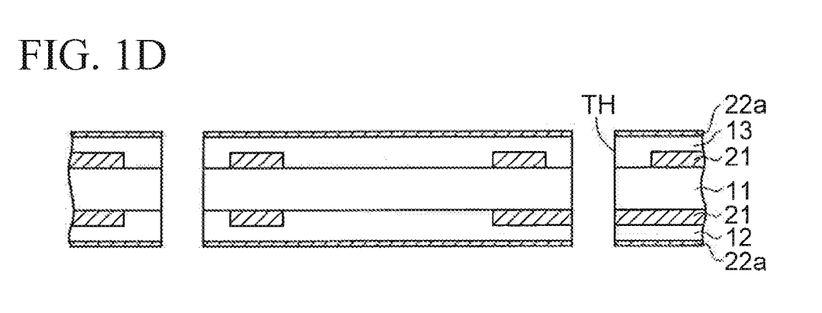

Then, as depicted in FIG. 1D, the laminated body in FIG. 1C is penetration-processed in the thickness direction by a laser, a drill, or the like to form through-holes TH. The diameter of each through-hole TH is set to about 200 μm to 300 μm.

Figure 2A:
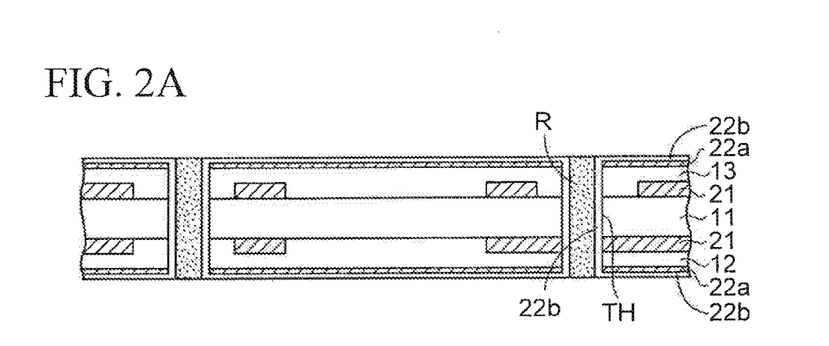

Thereafter, as depicted in FIG. 2A, a through-hole plating layer 22b made of copper or the like is formed by electroless plating and electroplating on the copper foils 22a on both faces side and the inner faces of the through-holes TH. Further, a resin body R of epoxy resin or the like is filled into the remaining hole of each through-hole TH.

Figure 2B:
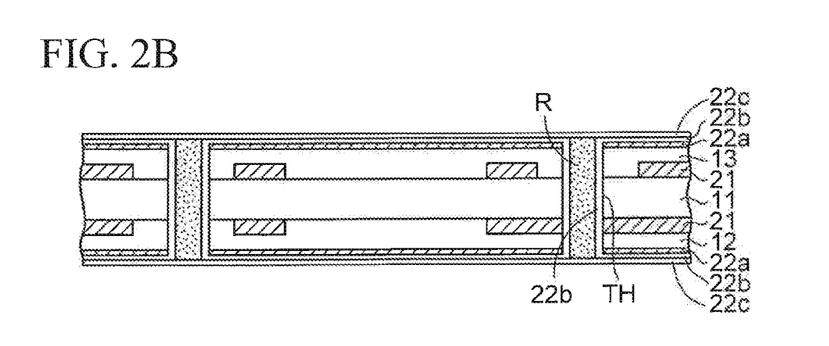

Subsequently, as depicted in FIG. 2B, a metal plating layer 22c made of copper or the like is formed by electroless plating and electroplating on the through-hole plating layers 22b and the resin body R on both faces side.

Further, the metal plating layers 22c. the through-hole plating layers 22b. and the copper foils 22a on both faces side of the laminated body in FIG. 2B are patterned by photolithography and wet etching.

Figure 2C:
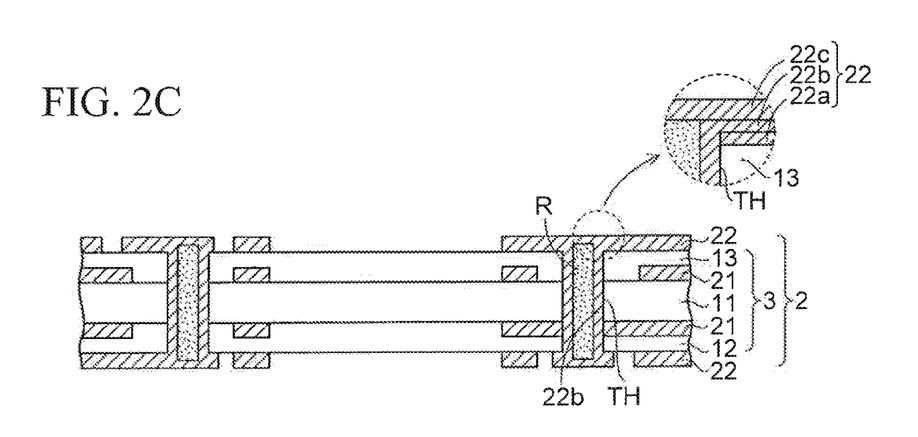

By this matter, as depicted in FIG. 2C, a second wiring layer 22 is formed on the second and third core members 12, 13 on both faces side respectively. The thickness of the second wiring layer 22 is set to about 18 μm to 35 μm.

As depicted in the partially enlarged cross-sectional view in FIG. 2C, the second wiring layer 22 is formed of the cooper foil 22a. the through-hole plating layer 22b. and the metal plating layer 22c laminated in this order from the bottom. The second wiring layers 22 on both faces side are connected each other through the through-hole plating layers 22b.

By the above steps, a core wiring substrate 2 to be used in this embodiment is obtained. As depicted in FIG. 2C, in the core wiring substrate 2, a core substrate 3 is formed of the first core member 11, and the second core members 12 and third core members 13 arranged on both faces side of the first core member 11. The first wiring layers 21 are formed on both faces side of the first core member 11 respectively.

The second wiring layers 22 are formed on both faces side of the core substrate 3 respectively. Further, the through-holes TH are formed which penetrate the core substrate 3 in the thickness direction. The second wiring layers 22 on both faces side are electrically connected each other through the through-hole plating layers 22b formed on the sidewalls of the through-hole TH. The resin body R is filled in each remaining hole of the through-holes TH. Moreover, the first wiring layer 21 on the lower face of the first core member 11 is electrically connected to the through-hole plating layers 22b.

Note that, in the example of FIG. 2C, although the resin body R is filled in the remaining hole of the through-hole TH, a metal plating layer made of copper or the like may be buried in the entire inside of each through-hole TH. Moreover, the number of laminated wiring layers can be set to any number.

As mentioned above, in this embodiment, the core wiring substrate 2 including the core substrate 3, and the first and second wiring layers 21, 22 formed in the inside and on both faces of the core substrate 3 is made. The first and second wiring layers 21, 22 are formed to constitute a required electric circuit.

Figure 3A:
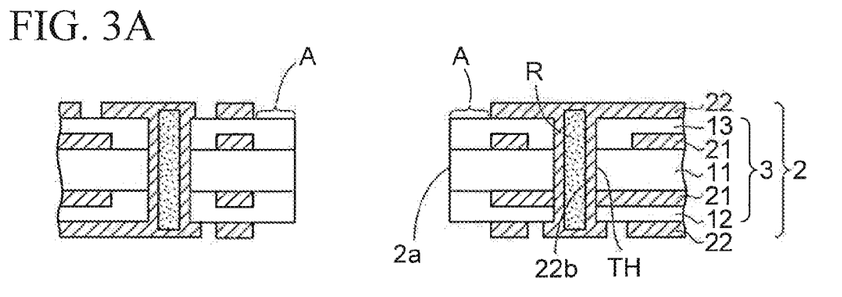
FIGS. 3A to 3C are cross-sectional views depicting the method of manufacturing an electronic component built-in substrate of the embodiment (Part 3).

Next, a method of building an electronic component into the core wiring substrate 2 will be explained. As depicted in FIG. 3A, first, an opening portion 2a is formed in a center part of the core wiring substrate 2 in FIG. 2C by punching using a die, the opening portion 2a penetrating the center part from the upper face to the lower face. The opening portion 2a may be formed by laser processing or drilling instead of punching. The opening portion 2a is also called a cavity.

The opening portion 2a of the core wiring substrate 2 is formed in, for example, a quadrangle shape in a plan view. As mentioned later, an electronic component will be arranged in the opening portion 2a. In the case that the large core wiring substrate 2 for the multi production is used, the opening portion 2a is arranged in the product areas defined in a plurality of sections respectively.

At this time, the opening portion 2a is formed, such that an exposed face A is arranged in which the second wiring layer 22 recedes outward and the upper face of the third core member 13 is exposed, on the core wiring substrate 2 in an outer periphery area of the opening portion 2a. The exposed face A is arranged with an annular shape in the outer periphery area along the opening portion 2a.

Figure 3B:
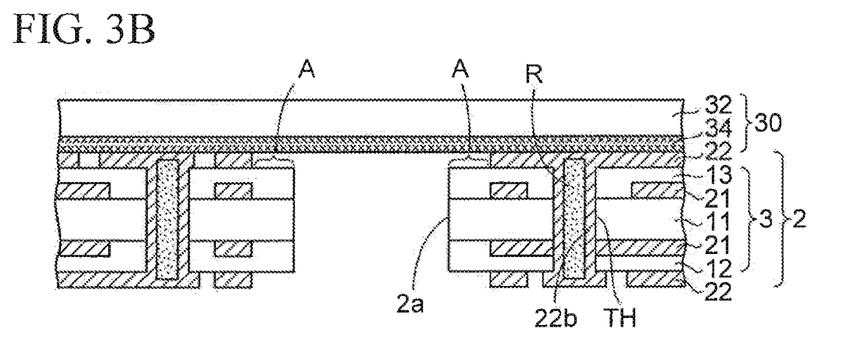

Then, as depicted in FIG. 3B, a temporary holding tape 30 is attached to the upper face of the core wiring substrate 2. The temporary holding tape 30 needs to be able to withstand a heating process when curing the resin, therefore a tape having a heat resistance of 200° C. or more is used. In the drawings of FIG. 3B and the following figures, the lower face of the core wiring substrate 2 is illustrated as one face of the substrate, and the upper face is illustrated as the other face of the substrate.

As such a temporary holding tape 30, a highly heat-resistant film 32 of polyimide, PET, or the like having an adhesive layer 34 laminated on one face thereof is used. The adhesive layer 34 is made of polyimide, for example. Then, the adhesive layer 34 side of the temporary holding tape 30 is temporarily bonded to the upper face of the core wiring substrate 2.

In this embodiment, the temporary holding tape 30 including the adhesive layer 34 having high bonding strength is employed, such that the misalignment and the inclination of the electronic component do not occur by the filling pressure of the resin when the electronic component which is to be mounted is sealed with the resin.

Figure 3C:
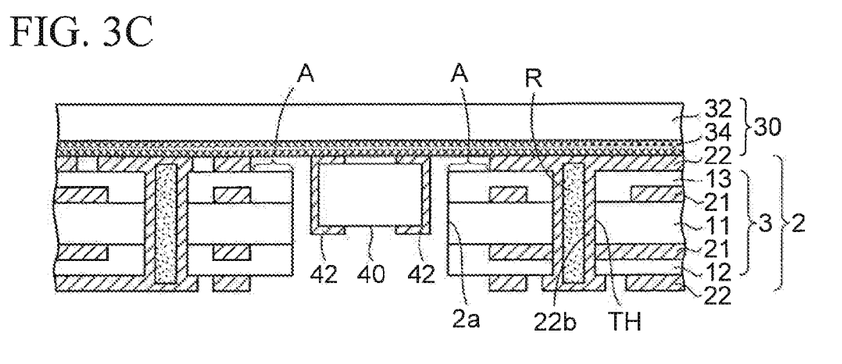

Subsequently, as depicted in FIG. 3C, a chip capacitor 40 is arranged by temporarily bonding on the temporary holding tape 30 in the opening portion 2a of the core wiring substrate 2. The opening portion 2a of the core wiring substrate 2 is formed such that its surface area is one size larder than the surface area of the chip capacitor 40 which is built in.

The chip capacitor 40 includes a pair of connection terminals 42 at the both end sides of the lateral direction, and the pair of connection terminals 42 is arranged along a horizontal direction parallel to the surface of the core wiring substrate 2.

The connection terminals 42 of the chip capacitor 40 are formed to extend from the both side faces to end parts of the upper and lower faces of the chip capacitor 40. In the example of FIG. 3C, the thickness of the whole of the chip capacitor 40 is set to be smaller than the thickness of the whole of the core wiring substrate 2. Alternatively, the thickness of the whole of the chip capacitor 40 may be set to be equal to the thickness of the whole of the core wiring substrate 2.

As an example of the chip capacitor 40, there is a ceramic chip capacitor in which the electrodes are provided on the both ends of the longitudinal direction of the main body of capacitor formed of the cuboidal body.

The chip capacitor 40 is illustrated as the electronic component. It is possible to use various other electronic components including connection terminals such as a semiconductor chip, a resistor element and an inductor element, or the like. Moreover, a plurality of electronic components may be arranged in one opening portion 2a of the core wiring substrate 2.

Figure 4A:
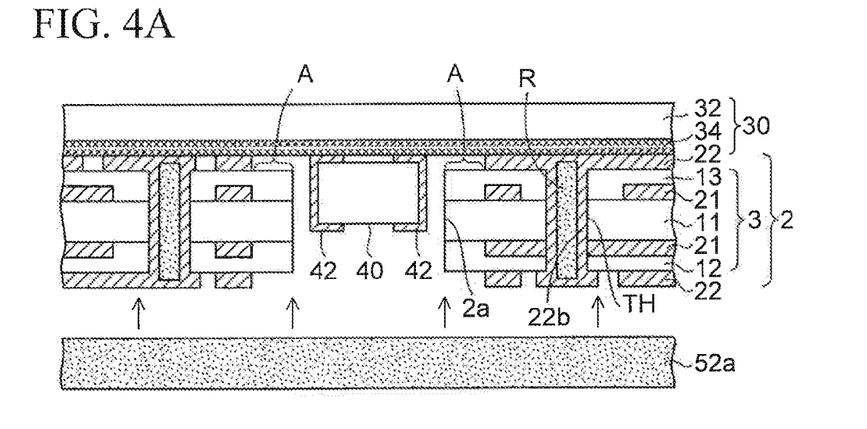
FIGS. 4A and 4B are cross-sectional views depicting the method of manufacturing an electronic component built-in substrate of the embodiment (Part 4).

Thereafter, as depicted in FIG. 4A, a resin film 52a whose thickness is about 25 μm to 40 μm in a semi-cured state (B stage) is prepared, and the resin film 52a is laminated onto the lower face of the core wiring substrate 2 by a vacuum laminator having a hot pressing function.

At this time, by hot pressing at a temperature of 130° C. to 150° C., the resin of the resin film 52a is fluidized and made to flow into the opening portion 2a. Then the resin is fully cured at a temperature of 180° C. to 200° C. Thermosetting epoxy resin, polyimide resin, or the like is used as the resin film 52a.

Figure 4B:
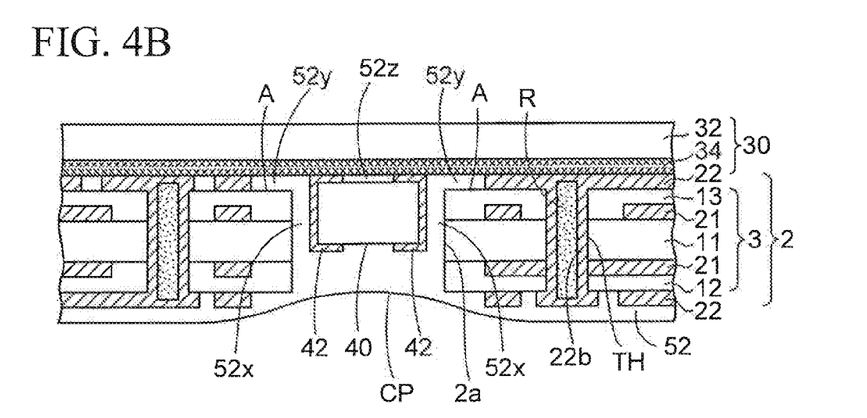

By this matter, as depicted in FIG. 4B, a first inner insulating layer 52 is formed on the lower face of the core wiring substrate 2. A gap between the chip capacitor 40 and the side face of the opening portion 2a of the core wiring substrate 2 is filled with a filling insulating portion 52x of the first inner insulating layer 52, and it is in a state that the chip capacitor 40 is sealed by the first inner insulating layer 52.

In this embodiment, since the adhesive layer 34 of the temporary holding tape 30 has high bonding strength, the chip capacitor 40 can withstand the filling pressure of the resin. Accordingly, it is prevented that the misalignment and the inclination of the chip capacitor 40 occur.

At this time, focusing on an outer area of an upper part of the chip capacitor 40 in FIG. 4B, a reinforcement insulating portion 52y of the first inner insulating layer 52 is simultaneously filled in an area between the annular exposed face A of the third core member 13 explained in FIG. 3A and the lower face of the temporary holding tape 30. Simultaneously with this, the first inner insulating layer 52 is also filled in a gap between the temporary holding tape 30 and an area between the connection terminals 42 of the chip capacitor 40 to thereby form another reinforcement insulating portion 52z.

Figure 5A:
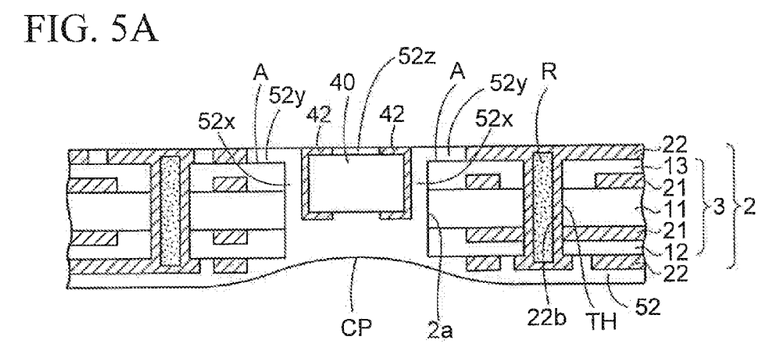
FIGS. 5A and 5B are a cross-sectional view and a plan view depicting the method of manufacturing an electronic component built-in substrate of the embodiment (Part 5).

Thereafter, as depicted in FIG. 5A, the temporary holding tape 30 is peeled from the core wiring substrate 2 and the chip capacitor 40. At this time, the chip capacitor 40 is firmly fixed to the core wiring substrate 2 by the reinforcement insulating portions 52z on the chip capacitor 40 and the reinforcement insulating portions 52y in the outer periphery area of the chip capacitor 40.

For this reason, even when the adhesive layer 34 of the temporary holding tape 30 has high bonding strength, it is prevent that the chip capacitor 40 is detached from the filing insulating portion 52x together with the temporary holding tape 30 and falling off.

Figure 5B:
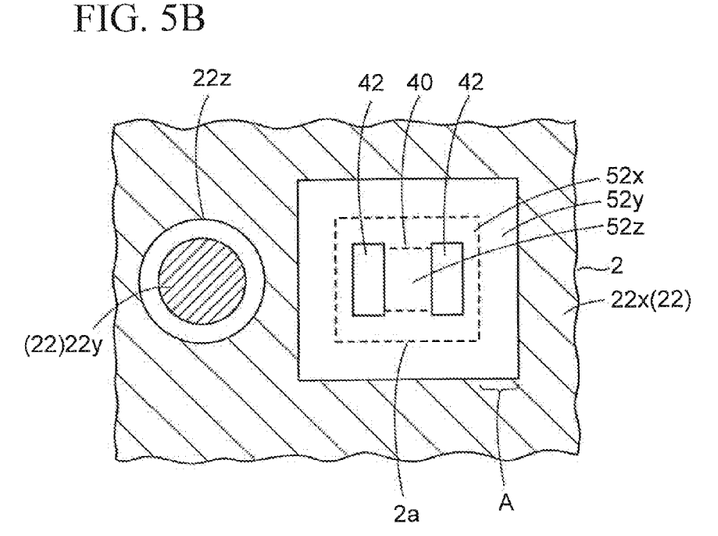

FIG. 5B is a partial plan view of the state of FIG. 5A as seen from above. As depicted in FIG. 5B, the chip capacitor 40 is arranged inside the quadrangle opening portion 2a of the core wiring substrate 2, and the filling insulating portion 52x is formed between the chip capacitor 40 and the side face of the opening portion 2a.

Moreover, the reinforcement insulating portions 52y. 52z connected to the filling insulating portion 52x are formed on the exposed face A of the third core member 13 in the outer periphery area of the opening portion 2a and on the chip capacitor 40.

In an outer area of the reinforcement insulating portion 52y, a plane layer 22x of the second wiring layer 22 is integrally formed. The plane layer 22x is formed as a power plane or a ground plane. The plane layer 22x is electrically connected to the second wiring layer 22 on the lower side through the through-hole plating layers 22b.

Moreover, a circular opening portion 22z is formed in the plane layer 22x. and a connection pad 22y of the second wiring layer 22 is arranged inside the opening portion 22z so as to be separated from the plane layer 22x. The connection pad 22y is electrically connected to the second wiring layer 22 on the lower side through the through-hole plating layers 22b.

Meanwhile, as in this embodiment, in the case that the thickness of the chip capacitor 40 is thinner than the thickness of the core wiring substrate 2, when the chip capacitor 40 in the opening portion 2a of the core wiring substrate 2 is sealed with the resin, it is formed as the structure in which the volume of the space to bury the resin is large.

For this reason, as depicted in FIG. 5A, the first inner insulating layer 52 in the area of the opening portion 2a of the core wring substrate 2 is formed as a depressed portion CP sink no toward the chip capacitor 40. In this way, when the chip capacitor 40 arranged in the opening portion 2a of the core wiring substrate 2 is sealed with the first inner insulating layer 52, the depressed portion CP which is depressed toward the inside is generated in the lower face of the first inner insulating layer 52. When the depressed portion CP is generated in the first inner insulating layer 52, it is difficult to form the fine wiring layer thereon with a good yield.

For example, in the case that the wiring layer is formed by a semi-additive method, when a dry film resist layer is patterned on a seed layer, a resist pattern layer is arranged to float above the depressed portion CP. Therefore, such problem is generated that the adjoining wiring layers are formed to be connected at their lower sides.

Figure 6A:
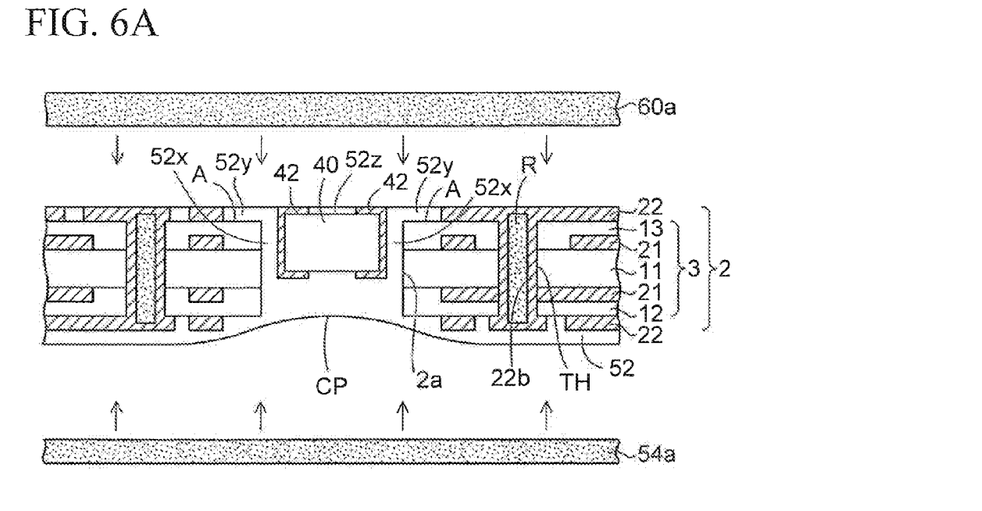
FIGS. 6A and 6B are cross-sectional views depicting the method of manufacturing an electronic component built-in substrate of the embodiment (Part 6).

As this countermeasure, in this embodiment, as depicted in FIG. 6A, a resin film 54a for flattening is laminated on the lower face of the core wiring substrate 2. Also simultaneously, a resin film 60a is laminated on the upper face of the core wiring substrate 2. Thermosetting epoxy resin, polyimide resin, or the like is used as the resin films 54a. 60a.

Then, similarly to the method of forming the first inner insulating layer 52 mentioned above, the resin films 54a. 60a on both faces side are hot pressed at a temperature of 130° C. to 150° C. by a vacuum laminator having a hot pressing function to be fluidized, and are then fully cured at a temperature of 180° C. to 200° C.

Figure 6B:
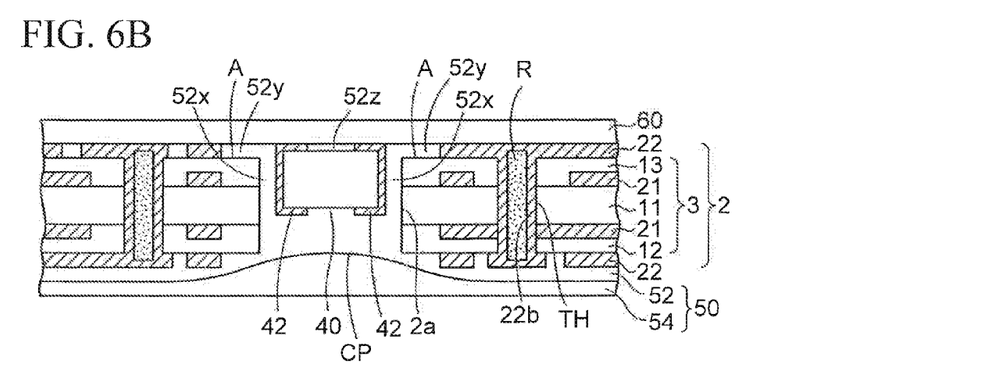

By this matter, as depicted in FIG. 6B, a first outer insulating layer 54 is laminated and formed on the first inner insulating layer 52 on the lower face of the core wiring substrate 2. At this time, in the lower face of the core wiring substrate 2, the depressed portion CP of the first inner insulating layer 52 is filled with the first outer insulating layer 54 and is flattened. In this way, the lower face of the first outer insulating layer 54 is formed as a flat surface as compared with the first inner insulating layer 52.

By the above steps, a first insulating layer 50 is formed on the lower face of the core wiring substrate 2 by the first inner insulating layer 52 in which the chip capacitor 40 is buried and the first outer insulating layer 54 which covers the first inner insulating layer 52.

Also simultaneously, in the upper face of the core wiring substrate 2, a second insulating layer 60 is formed on the core wiring substrate 2, the chip capacitor 40, and the reinforcement insulating portions 52y. 52z.

The first outer insulating layer 54 is formed not only to flatten the depressed portion CP of the first inner insulating layer 52 as described above, but also to set the surface roughness of the insulating layers on both faces side to the same degree.

Meanwhile, in the case that the first outer insulating layer 54 is not formed on the first inner insulating layer 52 unlike this embodiment, when the second insulating layer 60 is formed, the surface of the first inner insulating layer 52 is further exposed to the heating process. Thus, it is in a state that the surface of the first inner insulating layer 52 is cured more firmly than the second insulating layer 60.

For this reason, when roughened faces for anchoring wiring layers are formed by a desmear process, asperities are sufficiently formed in the surface of the second insulating layer 60 by etching and the surface becomes a required roughened face, whereas the surface of the first inner insulating layer 52 is not etched easily, the surface is not roughened sufficiently.

Therefore, since the lower face of the first inner insulating layer 52 is not roughened sufficiently, when the wiring layer is formed, sufficient adhesion can not obtained.

To solve this, at the same time as when the second insulating layer 60 is formed on the upper face of the core wiring substrate 2, the first outer insulating layer 54 is formed on the first inner insulating layer 52 on the lower face of the core wiring substrate 2. By this matter, the first outer insulating layer 54 and the second insulating layer 60 have the same heat history.

For this reason, the roughened face having sufficient surface roughness with the same specification can be formed respectively on the each surface of the first outer insulating layer 54 and the second insulating layer 60 on both faces side.

It is desirable that the difference in thickness between the first insulating layer 50 and the second insulating layer 60 is set within the range of ±20% or less and preferably within the range of ±10% or less. More preferably, the each thickness of the first insulating layer 50 and the second insulating layer 60 is set to be substantially equal. In the case that the first insulating layer 50 and the second insulating layer 60 are to have substantially the equal thickness, their thicknesses are set as follows, for example.

In a case that as the thickness of the first insulating layer 50 in FIG. 6B mentioned above, the thickness of the first inner insulating layer 52 is 10 μm and the thickness of the first outer insulating layer 54 is 20 μm, the thickness of the second insulating layer 60 in FIG. 6B is set to 30 μm. The thickness of the first insulating layer 50 is the thickness from the lower face of the second wiring layer 22 to the surface of the first insulating layer 50. Moreover, the thickness of the second insulating layer 60 is the thickness from the upper face of the second wiring layer 22 to the surface of the second insulating layer 60.

By setting the thicknesses of the first and second insulating layers 50, 60 on both faces side of the core wiring substrate 2 to the equal thickness, it is constituted as the strong structure to the warp. Note that insulating resin is illustrated as the insulating layers. A different insulating material can instead be used.

Figure 7A:
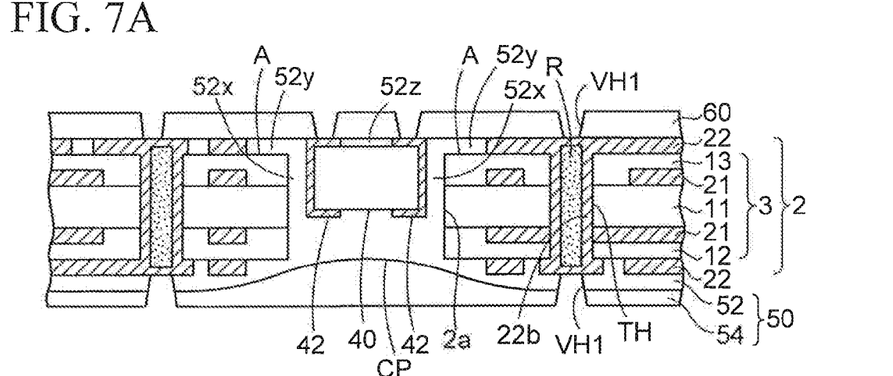

Then, as depicted in FIG. 7A, the second insulating layer 60 on the upper side of the core wiring substrate 2 is processed by a laser or the like to form first via holes VH1. The first via holes VH1 are arranged to reach the upper faces of the connection terminals 42 of the chip capacitor 40 and the upper faces of connection parts of the second wiring layer 22.

Also simultaneously, the first outer insulating layer 54 and the first inner insulating layer 52 on the lower side of the core wiring substrate 2 are processed by a laser or the like to form other first via holes VH1 reaching the second wiring layer 22.

Figure 7B:
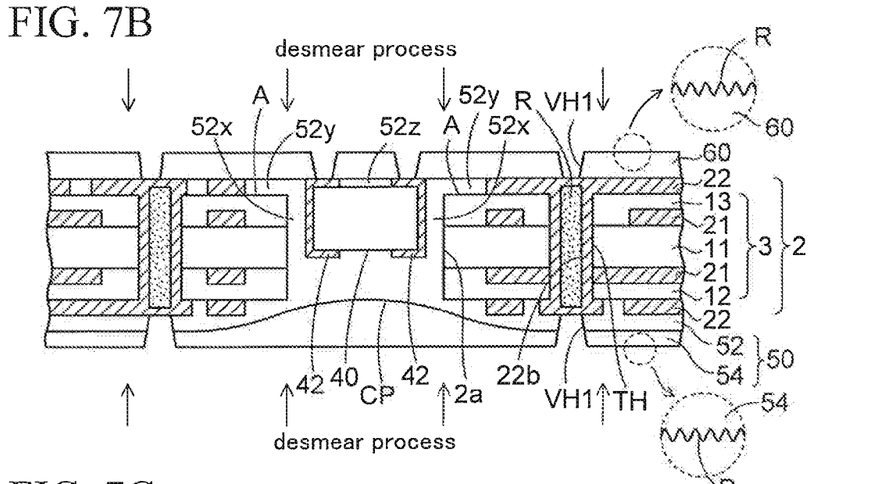

Thereafter, as depicted in FIG. 7B, a desmear process using a potassium permanganate solution or the like is performed on the inside of the first via holes VH1 on both faces side of the core wiring substrate 2 to clean resin smears remaining on the bottoms in the first via holes VH1.

At this time simultaneously, as depicted in the partially enlarged cross-sectional view in FIG. 7B, asperities are formed on the surfaces of the first outer insulating layer 54 and the second insulating layer 60 on both faces side by the desmear process, so that the surfaces thereof become roughened faces R.

The surface roughness (Ra) of each of the roughened faces R of the first outer insulating layer 54 and the second insulating layer 60 is set to 500 nm or less, and preferably to 100 nm to 400 nm.

As mentioned above, the first outer insulating layer 54 and the second insulating layer 60 have the same heat history up to this point because they have only been subjected to the heating process for forming themselves. Therefore, roughened faces R of adequate surface roughness with the same specifications are formed on the first outer insulating layer 54 and the second insulating layer 60.

The surface roughness of other insulating layers to be mentioned later are also set within the same range as that of the first outer insulating layer 54 and the second insulating layer 60.

The permanganate method is illustrated as the method for the desmear process. Plasma etching, blasting, or the like may instead be used. In the case of using plasma etching, the desmear process is performed by using a dry etching apparatus using a mixed gas in which $O_2$, $N_2$, or the like is mixed to $CF_4$, for example.

Figure 7C:
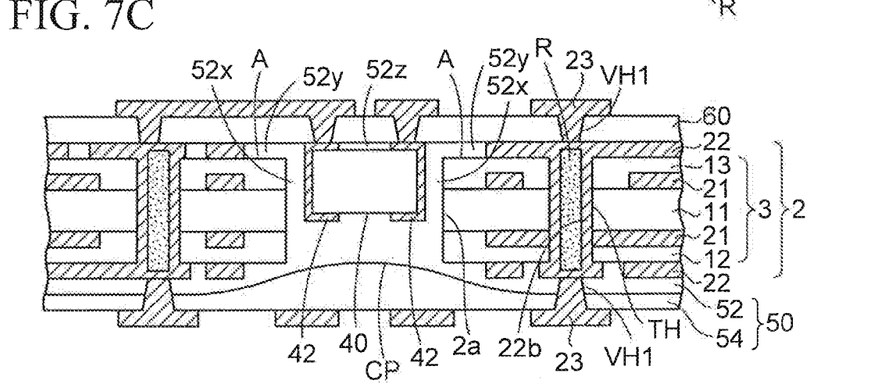

Further, as depicted in FIG. 7C, a third wiring layer 23 is formed on the second insulating layer 60 on the upper side of the core wiring substrate 2, the third wiring layer 23 being connected to the connection terminals 42 of the chip capacitor 40 and the second wiring layer 22 through via conductors in the first via holes VH1.

Also simultaneously, another third wiring layer 23 is formed on the first insulating layer 50 on the lower side of the core wiring substrate 2, the third wiring layer 23 being connected to the second wiring layer 22 through via conductors in the first via holes VH1.

Since the surfaces of the first outer insulating layer 54 and the second insulating layer 60 are adequately roughened, the third wiring layers 23 are formed on the first outer insulating layer 54 and the second insulating layer 60 with good adhesion thereto by the anchoring effect of the roughened faces.

The third wiring layer 23 is formed by a semi-additive method, for example. Specifically, in the upper face side of the core wiring substrate 2, first, a seed layer (not depicted) made of copper or the like is formed on the second insulating layer 60 and the inner faces of the first via holes VH1 by electroless plating or sputtering.

Then, a plating resist layer (not depicted) is formed on the seed layer by photolithography, the plating resist layer in which opening portions are provided in regions in which the third wiring layer 23 is to be arranged. Further, a metal plating layer (not depicted) made of copper or the like is formed from the inside of the first via holes VH1 to the opening portions of the plating resist layer by electroplating utilizing the seed layer as a plating power feeding path.

Subsequently, the plating resist layer is removed, and thereafter while using the metal plating layer as a mask, the seed layer is etched and removed. By this matter, the third wiring layer 23 formed of the seed layer and the metal plating layer is obtained.

As mentioned above, when the thicknesses of the first and second insulating layers 50, 60 on both faces side of the core wiring substrate 2 are set to the equal thickness, the depth and shape of the first via holes VH1 become the same on both faces side. For this reason, the metal plating layers can be reliably buried into the first via holes VH1 on both faces side under the same electroplating conditions.

The other third wiring layer 23 is also formed on the lower face side of the core wiring substrate 2 in the similar method at the same time.

It is preferable to form the other wiring layers by the semi-additive method. However, a different wiring forming method such as a subtractive method or a full-additive method may instead be used.

In this embodiment, the first and second wiring layers 21, 22 constituting a required electric circuit are formed in the core wiring substrate 2. Therefore, the chip capacitor 40 and the second wiring layer 22 of the core wiring substrate 2 can be easily connected by the third wiring layer 23 through the first via holes VH1 formed in the second insulating layer 60 formed on the chip capacitor 40 and the second wiring layer 22.

Here, in FIGS. 7B and 7C, when the first via holes VH1 are formed in the first insulating layer 50 on the lower face side of the core substrate 3, the first via holes reaching the connection terminals 42 located to the lower side of the chip capacitor 40 may be formed at the same time. In this mode, such mode may be employed that the third wiring layer 23 formed on the first insulating layer 50 is connected to the connection terminals 42 of the chip capacitor 40 through via conductors in the first via holes.

Figure 8A:
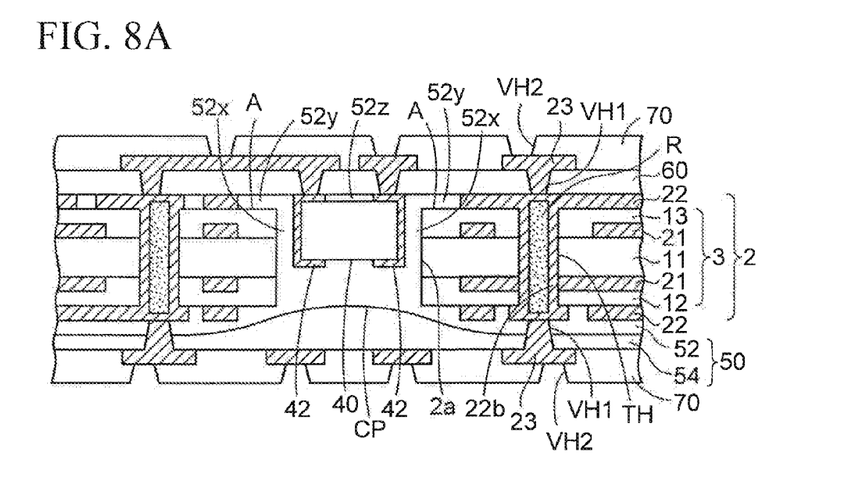
FIGS. 8A and 8B are cross-sectional views depicting the method of manufacturing an electronic component built-in substrate of the embodiment (Part 8).

Thereafter, as depicted in FIG. 8A, steps similar to those in FIGS. 6B to 7B mentioned above are repeated. By this matter, in both faces side of the core wiring substrate 2, a third insulating layer 70 is formed on each of the first insulating layer 50 and the second insulating layer 60 respectively, the third insulating layers 70 having second via holes VH2 on connection parts of the third wiring layers 23.

Figure 8B:
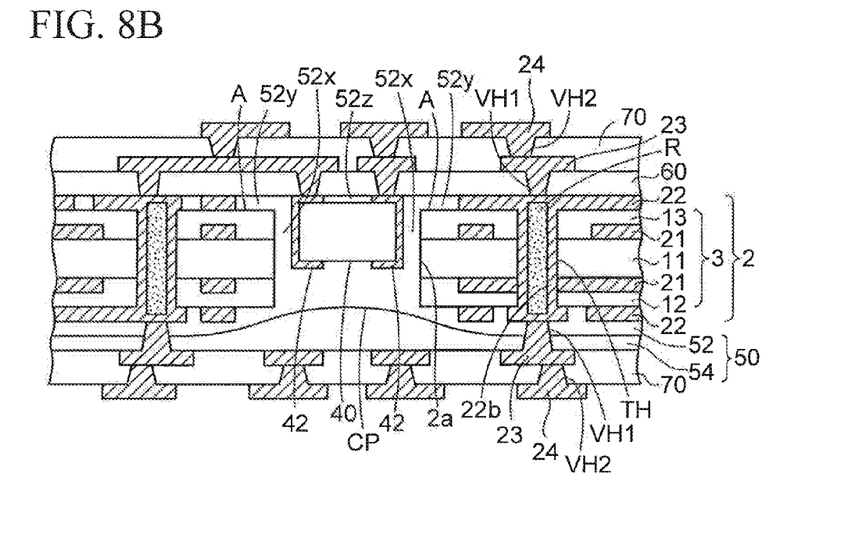

Further, as depicted in FIG. 8B, by the method similar to that in FIG. 7C mentioned above, in both faces side of the core wiring substrate 2, a fourth wiring layer 24 is formed on each of the third insulating layers 70 respectively, the fourth wiring layers 24 being connected to the third wiring layers 23 through via conductors in the second via holes VH2.

Figure 9:
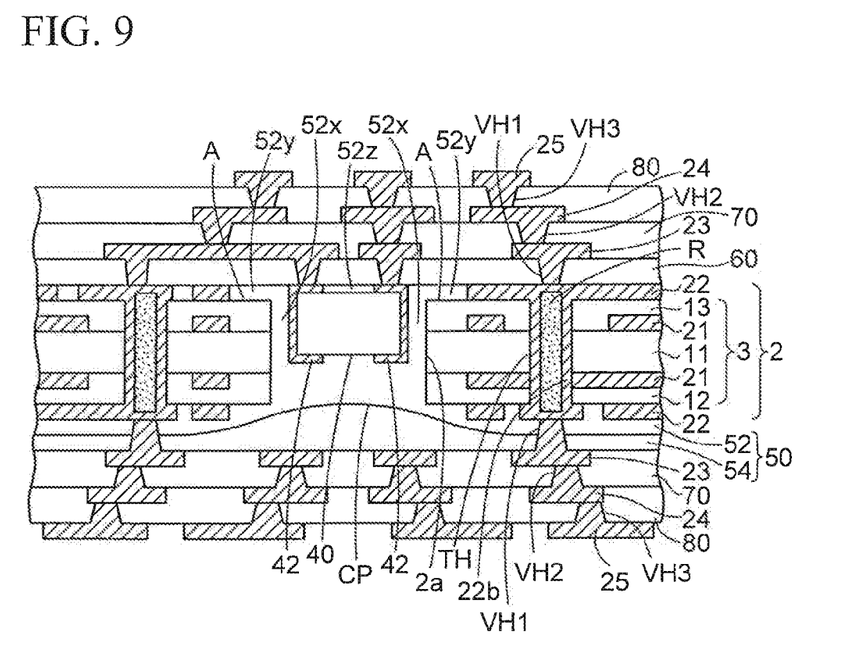
FIG. 9 is a cross-sectional view depicting the method of manufacturing an electronic component built-in substrate of the embodiment (Part 9).
Figure 10:
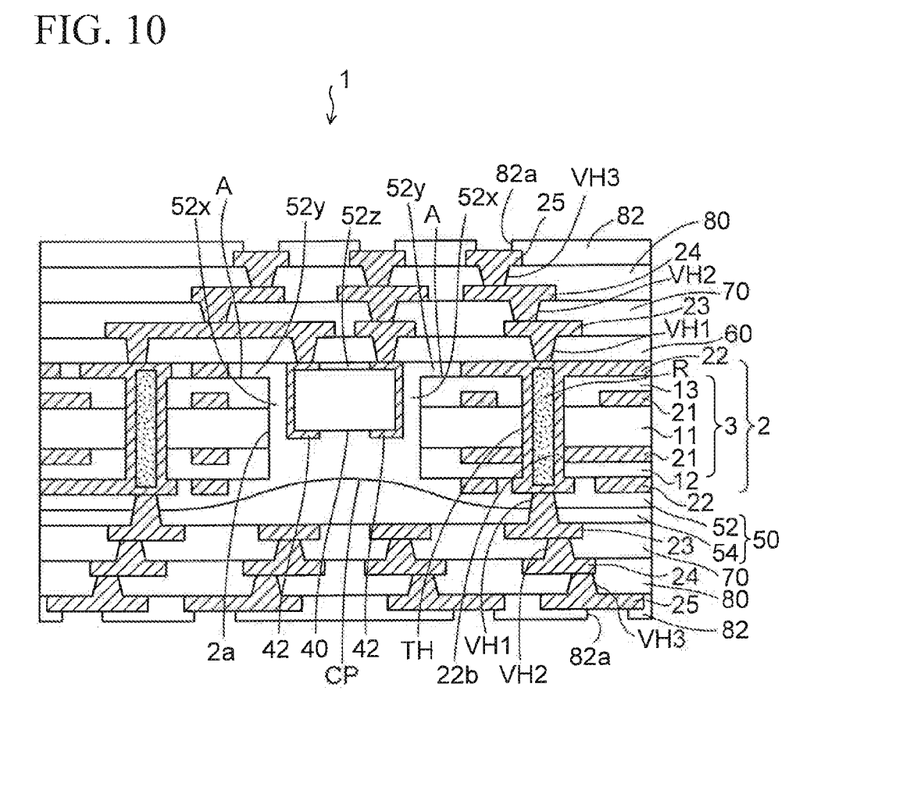
FIG. 10 is a cross-sectional view depicting an electronic component built-in substrate of the embodiment.

Subsequently, as depicted in FIG. 9, by the method similar to that in FIGS. 6B to 7B mentioned above, an both faces side of the core wiring substrate 2, a fourth insulating layer 80 is formed on each of the third insulating layers 70, the fourth insulating layers 80 having third via holes VH3 above connection parts of the fourth wiring layers 24.

Further, likewise as depicted in FIG. 9, by the method similar to that in FIG. 7C mentioned above, in both faces side of the core wiring substrate 2, a fifth wiring layer 25 is formed on each of the fourth insulating layers 80 respectively, the fifth wiring layers 25 being connected to the fourth wiring layers 24 through via conductors in the third via holes VH3.

Thereafter, as depicted in FIG. 10, in both faces side of the core wiring substrate 2, a solder resist layer 82 is formed on each of the fourth insulating layers 80 respectively, the solder resist layers 82 in which opening portions 82a are provided on connection parts of the fifth wiring layers 25.

By the above steps, an electronic component built-in substrate 1 of the embodiment is obtained. Note that, in the case that the large core wiring substrate 2 for the multi production is used, the structure is divided such that each of the-electronic component built-in substrate 1 is obtained from each product area.

As depicted in FIG. 10, in the electronic component built-in substrate 1 of the embodiment, the core wiring substrate 2 explained in FIG. 3C mentioned above is arranged in a center part thereof in the thickness direction, and the opening portion 2a penetrating in the thickness direction is provided in the center part of the core wiring substrate 2.

In the core wiring substrate 2, the core substrate 3 is formed by arranging the second core member 12 and the third core member 13 on both faces of the first core member 11. The first wiring layers 21 are formed on both faces of the first core member 11 respectively. Moreover, the second wiring layers 22 are formed on both faces of the core substrate 3 respectively.

The second wiring layers 22 on both faces side are connected each other through the through-hole plating layers 22b in the through-holes TH. The first and second wiring layers 21, 22 are formed so as to constitute a required electric circuit.

Moreover, as explained in FIG. 3A mentioned above, the exposed face A in Which the second wiring layer 22 recedes outward and the upper face of the third core member 13 is exposed, is arranged on the core wiring substrate 2 in the outer periphery area of the opening portion 2a.

Then, the chip capacitor 40 including the pair of connection terminals 42 at the both ends side is arranged inside the opening portion 2a of the core wiring substrate 2. The chip capacitor 40 is arranged such that the pair of connection terminals 42 is arranged so as to align in the horizontal direction. The thickness of the chip capacitor 40 is set to be thinner than the thickness of the core wiring substrate 2, and the chip capacitor 40 is arranged in a part of an upper side in the opening portion 2a.

The first inner insulating layer 52 which seals the chip capacitor 40 is formed on the lower face of the core wiring substrate 2. The first inner insulating layer 52 is formed to include the filling insulating portion 52x which fills form the area between the chip capacitor 40 and the side face of the opening portion 2a of the core wiring substrate 2 to the area under the chip capacitor 40.

Moreover, the second insulating layer 60 is formed on the upper face of the core wiring substrate 2. Then, the first inner insulating layer 52 is formed to include the reinforcement insulating portions 52y. 52z, which are connected to the filling insulating portion 52x. between the exposed face A of the third core member 13 in the outer periphery area of the opening portion 2a and the second insulating layer 60, and between the chip capacitor 40 and the second insulating layer 60.

Further, the first outer insulating layer 54 is formed on the lower face of the first inner insulating layer 52. The lower face of the first outer insulating layer 54 is formed to be flat all over. The first insulating layer 50 is formed of the first inner insulating layer 52 and the first outer insulating layer 54.

Moreover, the first via holes VH1 are formed in each of the first insulating layer 50 and the second insulating layer 60 on both faces side and reach the second wiring layers 22.

Further, the third wiring layers 23 are formed on the first insulating layer 50 and the second insulating layer 60 on both faces side respectively, and connected to the second wiring layers 22 through the via conductors in the first via holes VH1. In the upper face side of the core wiring substrate 2, the connection terminals 42 of the chip capacitor 40 are electrically connected to the second wiring layer 22 of the core wiring substrate 2 by the third wiring layer 23 and the via conductors in the first via holes VH1.

Also similarly, the third insulating layers 70 are formed on the first insulating layer 50 and the second insulating layer 60 on both faces side respectively, and have the second via holes VH2 reaching the third wiring layers 23. Further, the fourth wiring layers 24 are formed on the third insulating layers 70 on both faces side respectively, and connected to the third wiring layers 23 through the via conductors in the second via holes VH2.

Also similarly, the fourth insulating layers 80 are formed on the third insulating layers 70 on both faces side respectively, and have the third via holes VH3 reaching the fourth wiring layers 24. Further, the fifth wiring layers 25 are formed on the fourth insulating layers 80 on both faces side respectively, and connected to the fourth wiring layers 24 through the via conductors in the third via holes VH3.

Further, the solder resist layers 82 are formed on the fourth insulating layers 80 on both faces side respectively, the solder resist layers 82 in which the opening portions 82a are provided on the connection parts of the fifth wiring layers 25.

In the electronic component built-in substrate 1 of this embodiment, when the chip capacitor 40 arranged in the opening portion 2a of the core wiring substrate 2 is sealed, the first inner insulating layer 52 is buried around the chip capacitor 40 and thereafter the first outer insulating layer 54 for flattening is formed.

By this matter, particularly, in the case that the thickness of the chip capacitor 40 is thinner than the thickness of the core wiring substrate 2, even when the depressed portion CP is generated in the part of the first inner insulating layer 52 filling the opening portion 2a. the depressed portion CP can be flattened by the first outer insulating layer 54.

Moreover, the second insulating layer 60 is formed on the upper face of the core wiring substrate 2 at the same time as when the first outer insulating layer 54 is formed under the first inner insulating layer 52 formed on the lower face of the core wiring substrate 2. By this matter, the first outer insulating layer 54 and the second insulating layer 60 on both faces of the core wiring substrate 2 have the same heat history.

Accordingly, the roughened faces having sufficient surface roughness can be formed on the first outer insulating layer 54 and the second insulating layer 60. Thus, the third wiring layers 23 having the fine pattern can be formed on the first outer insulating layer 54 and the second insulating layer 60 at a good yield.

Moreover, in the electronic component built-in substrate 1 of this embodiment, the core wiring substrate 2 includes the first and second wiring layers 21, 22 which constitute a required electric circuit. The second wiring layer 22 on the upper face of the core wiring substrate 2 is arranged in an adjacent area in the lateral direction of the connection terminals 42 of the chip capacitor 40.

By this matter, the connection terminals 42 of the chip capacitor 40 and the second wiring layer 22 of the core wiring substrate 2 can be easily connected by the third wiring layer 23 which goes through the first via holes VH1 formed in the second insulating layer 60 located on the connection terminals 42 and the second wiring layer 22.

Moreover, in a preferred mode, the thickness is set to be equal between the first insulating layer 50 formed on the lower face of the core wiring substrate 2 to seal the chip capacitor 40, and the second insulating layer 60 formed on the upper face of the core wiring substrate 2. By this matter, it is constituted as the strong structure to the warp, and the metal plating layers can be reliably buried into the first via holes VH1 on both sides under the same plating conditions.

Figure 11:
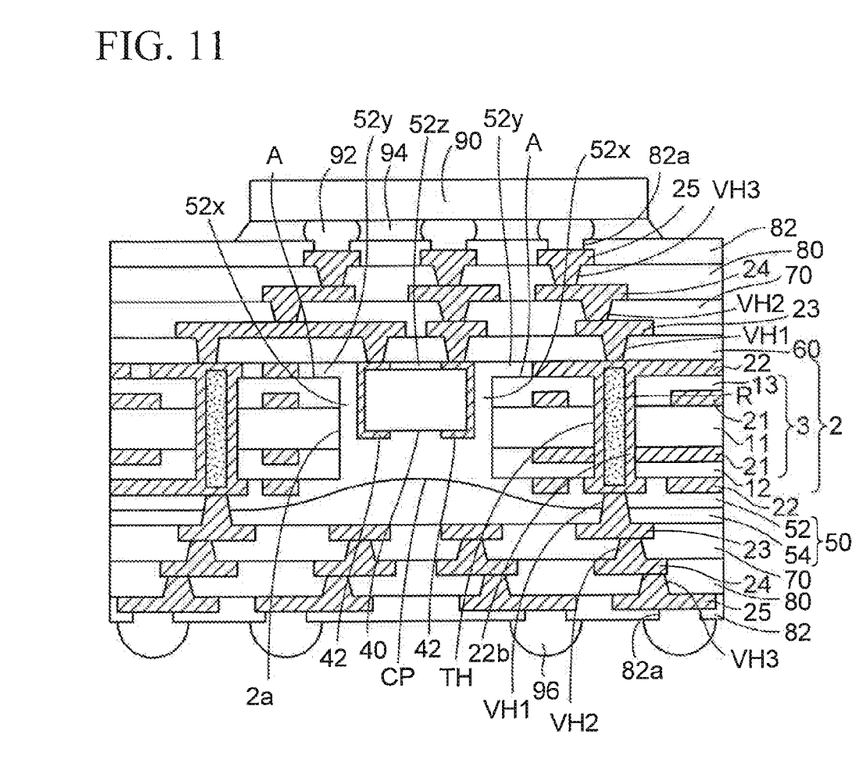
FIG. 11 is cross-sectional view depicting a state that a semiconductor chip is mounted on the electronic component built-in substrate of the embodiment.

FIG. 11 depicts a state that a semiconductor chip is mounted on the electronic component built-in substrate 1 in FIG. 10. As depicted in FIG. 11, connection parts of a semiconductor chip 90 are flip-chip connected to the fifth wiring layer 25 on the upper face side of the electronic component built-in substrate 1 in FIG. 10 through bump electrodes 92 of solder or the like.

Thereafter, underfill resin 94 is filled into a gap between the semiconductor chip 90 and the electronic component built-in substrate 1. In this way, the outermost face of the electronic component built-in substrate 1 in FIG. 10 on the second insulating layer 60 side is formed as a component mounting face for mounting the semiconductor chip 90.

Further, external connection terminals 96 are formed on the fifth wiring layer 25 (pad) on the lower side of the electronic component built-in substrate 1 by, for example, mounting solder balls.

In the example of FIG. 11, the chip capacitor 40 of the electronic component built-in substrate 1 is arranged as a decoupling capacitor between a power supply line and a ground line for the purpose of stabilizing the power supply voltage of the semiconductor chip 90 and reducing high frequency noise.

In this embodiment, the combination in which the chip capacitor 40 is built in the substrate and the semiconductor chip 90 is mounted on the surface of the substrate is illustrated. The present invention is applicable to combinations of various electronic components. Moreover, the present invention is applicable to the modes that no wiring layer is formed in the core substrate.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. An electronic component built-in substrate, comprising:
a substrate having an opening portion;
a first wiring layer formed on the substrate;
an electronic component arranged in the opening portion;
a first insulating layer formed on one face of the substrate and sealing the electronic component;
a second insulating layer formed on other face of the substrate;
a second wiring layer formed on the first insulating layer; and
a third wiring layer formed on the second insulating layer,
wherein the first insulating layer is formed of an inner insulating layer covering a whole of the one face of the substrate, one face of the electronic component and the first wiring layer, the inner insulating layer filling a space between a side wall of the opening portion and a side wall of the electronic component, and an outer insulating layer formed to contact a whole of one face of the inner insulating layer.

2. The electronic component built-in substrate according to claim 1, wherein
the first wiring layer is formed on both faces of the substrate respectively,
the second wiring layer is connected to the first wiring layer through a via conductor formed in the inner insulating layer and the outer insulating layer, and
the third wiring layer is connected to a connection terminal of the electronic component and the first wiring layer through a via conductor formed in the second insulating layer.

3. The electronic component built-in substrate according to claim 1, wherein a thickness of the first insulating layer is substantially equal to a thickness of the second insulating layer.

4. The electronic component built-in substrate according to claim 1, wherein
a surface of the substrate in an outer periphery area of the opening portion is an exposed face that the first wiring layer recedes, and
a reinforcement insulating portion of the inner insulating layer is formed between the exposed face and the second insulating layer.

5. The electronic component built-in substrate according to claim 1, wherein
a depressed portion is formed in a region of the inner insulating layer filled in the opening portion, and
the outer insulating layer is formed on the inner insulating layer so as to fill the depressed portion, and a surface of the first insulating layer is flattened.

6. The electronic component built-in substrate according to claim 1, wherein an outermost face on the second insulating layer side of the electronic component built-in substrate is formed as a component mounting face for mounting a semiconductor chip.

7. The electronic component built-in substrate according to claim 1, wherein a conductive layer is not formed between the inner insulating layer and the outer insulating layer.

\* \* \* \* \*